(12) United States Patent
Müller et al.

(10) Patent No.: US 11,169,232 B2
(45) Date of Patent: Nov. 9, 2021

(54) DEVICE AND METHOD FOR ELECTRICALLY LINKING ELECTRONIC ASSEMBLIES BY MEANS OF SYMMETRICAL SHIELDED CABLES

(71) Applicant: Max-Planck-Gesellschaft zur Förderung der Wissenschaften e.V, Munich (DE)

(72) Inventors: Roland Müller, Leipzig (DE); Harald E. Möller, Leipzig (DE)

(73) Assignee: Max-Planck-Geselischaft zur Förderung der Wissenschaften e.V, Munich (DE)

(*) Notice: Subject to any disclaimer, the term of this patent is extended or adjusted under 35 U.S.C. 154(b) by 655 days.

(21) Appl. No.: 15/306,246

(22) PCT Filed: Mar. 26, 2015

(86) PCT No.: PCT/EP2015/056538
§ 371 (c)(1),
(2) Date: Oct. 24, 2016

(87) PCT Pub. No.: WO2015/161982
PCT Pub. Date: Oct. 29, 2015

(65) Prior Publication Data
US 2017/0045593 A1   Feb. 16, 2017

(30) Foreign Application Priority Data

Apr. 24, 2014  (DE) .................. 10 2014 105 800.3

(51) Int. Cl.
*G01R 33/36* (2006.01)
*H01P 3/06* (2006.01)
(Continued)

(52) U.S. Cl.
CPC ............ *G01R 33/3685* (2013.01); *H01P 3/06* (2013.01); *H01P 5/026* (2013.01); *H03H 7/42* (2013.01); *H03H 7/425* (2013.01); *H03H 7/38* (2013.01)

(58) Field of Classification Search
CPC .................................................. G01R 33/3685
(Continued)

(56) References Cited

U.S. PATENT DOCUMENTS 3,973,263 A * 8/1976 Green ...................... H01Q 7/04
                                                      343/744
4,839,594 A * 6/1989 Misic ............... G01R 33/34046
                                                      324/318

(Continued)

FOREIGN PATENT DOCUMENTS

DE   10113661 A1   9/2002
DE   69734233 T2   7/2006
(Continued)

OTHER PUBLICATIONS

Ackerman et al. (1980) "Mapping of metabolites in whole animals by 31P NMR using surface coils," Nature. 283:167-170.
(Continued)

*Primary Examiner* — Melissa J Koval
*Assistant Examiner* — Rahul Maini
(74) *Attorney, Agent, or Firm* — Leydig, Voit & Mayer, Ltd.

(57) ABSTRACT

The invention relates to a cable for electrically linking electronic assemblies, components or peripherals of a magnetic resonance apparatus by means of a symmetrical shielded cable which shields a plurality of conductors for a useful signal with respect to influences of an electromagnetic alternating field by means of at least one shielding device. In order to suppress sheath waves, a shielding device
(Continued)

comprises at at least one point an interruption which is bridged by an active resistance or a reactance.

18 Claims, 4 Drawing Sheets

(51) Int. Cl.
*H01P 5/02* (2006.01)
*H03H 7/42* (2006.01)
*H03H 7/38* (2006.01)

(58) Field of Classification Search
USPC .................................................. 324/322, 318
See application file for complete search history.

(56) References Cited

U.S. PATENT DOCUMENTS

| | | | | |
|---|---|---|---|---|
| 5,367,261 | A * | 11/1994 | Frederick | G01R 33/422 |
| | | | | 324/318 |
| 5,916,162 | A * | 6/1999 | Snelten | G01R 33/285 |
| | | | | 600/411 |
| 6,982,378 | B2 | 1/2006 | Dickson | |
| 7,019,527 | B2 * | 3/2006 | Kleihorst | G01R 33/3628 |
| | | | | 324/318 |
| 7,834,270 | B2 * | 11/2010 | Zhu | H01B 11/1895 |
| | | | | 174/105 R |
| 8,686,725 | B2 * | 4/2014 | Iannotti | G01R 33/3621 |
| | | | | 324/307 |
| 9,160,295 | B2 * | 10/2015 | Waks | H03H 7/0115 |
| 9,671,478 | B2 * | 6/2017 | Driesel | G01R 33/36 |
| 2003/0135110 | A1 | 7/2003 | Leussler | |
| 2006/0258936 | A1 | 11/2006 | Schulz | |
| 2010/0329527 | A1 | 12/2010 | Iannotti et al. | |
| 2011/0037471 | A1 | 2/2011 | Nozaki | |
| 2013/0181716 | A1 * | 7/2013 | Greim | G01R 33/422 |
| | | | | 324/322 |
| 2015/0048823 | A1 * | 2/2015 | Fackelmeier | G01R 33/341 |
| | | | | 324/309 |

FOREIGN PATENT DOCUMENTS

| | | |
|---|---|---|
| DE | 602004007641 T2 | 4/2008 |
| EP | 2 567 658 A1 | 3/2013 |
| WO | WO 2010/003215 A1 | 1/2010 |
| WO | WO 2011/051872 A2 | 5/2011 |

OTHER PUBLICATIONS

Boskamp et al. (2012) "Broadband Damping of Cable Modes," Proceedings of the 20th Annual Meeting of ISMRM, Melbourne, Australia, p. 2691.
Brunner et al. (2009) "Travelling-wave nuclear magnetic resonance," Nature. 457:994-999.
Driesel et al. (2008) "A microstrip helmet coil for human brain imaging at high magnetic fields," Concepts in Magnetic Resonance Part B: Magnetic Resonance Engineering. 33B:94-108.
Hayes et al. (1985) "An efficient, highly homogenous radiofrequency coil for whole-body NMR imaging at 1.5 T," Journal of Magnetic Resonance. 63:622-628.
Lee et al. (2001) "Planar strip array (PSA) for MRI," Magnetic Resonance in Medicine. 45:673-683.
Müller et al. (Apr. 25, 2014) "A Double-Row Transmit Array with Broadband Sheath-Wave Damping for 7T Human Head Imaging," Proc. Intl. Soc. Magn. Reson. Med. 22:1317.
Picard et al. (1995) "Improvements in Electronic Decoupling of Transmitter and Receiver Coils," Journal of Magnetic Resonance, Series B. 106:110-115.
Raajimakers et al. (2011) "Design of a Radiative Surface Coil Array Element at 7 T: The Single-Side Adapted Dipole Antenna," Magnetic Resonance in Medicine. 66:1488-1497.
Roemer et al. (1990) "The NMR phased array," Magnetic Resonance in Medicine. 16:192-225.
Terman (1937) "Analysis of Some Typical Coupled Circuits," Chapter 3, Section 17 In; Radio Engineering. 2nd Ed. McGraw-Hill Book Company, Inc. pp. 76-85.
International Search Report with Written Opinion corresponding to International Patent Application No. PCT/EP2015/056538, dated May 12, 2015.
Anonymous (Feb. 2014) "Balanced line—Wikipedia, the free encyclopedia," XP055595969,URL:https://web.archive.org/web/20140301011128/https://en.wikipedia.org/wiki/Balanced_line (found on Jun. 12, 2019).
European Examination Report, dated Jun. 19, 2019, corresponding to European Application No. 15 712 890.1, 4 pp.

* cited by examiner

DEVICE AND METHOD FOR ELECTRICALLY LINKING ELECTRONIC ASSEMBLIES BY MEANS OF SYMMETRICAL SHIELDED CABLES

CROSS-REFERENCE TO RELATED APPLICATIONS

This application is a U.S. National Stage Application filed under 35 U.S.C. § 371 of International Application No. PCT/EP2015/056538, filed Mar. 26, 2015, which claims the benefit of German Application No. 10 2014 105 800.3, filed Apr. 24, 2014. All of these applications are hereby incorporated by reference in their entireties.

The present invention relates to a device and to a method for electrically linking radio frequency (RF) coils by means of symmetrical, shielded cables.

In order to increase the resolution of magnetic resonance imaging (MRI) procedures, MRI machines (for example in medical diagnostics) are designed with greater amplitudes $B_0$ of the static magnetic field. In particular in the case of examinations of people, for example for medical purposes or research purposes, large resolutions are desirable, and therefore the magnetic field strength for such devices has been steadily increased in the past. MRI machines which can generate a magnetic field of 7 T or even greater are currently in operation for research purposes.

A similar trend can also be observed in the case of nuclear magnetic resonance (NMR) spectrometers.

Furthermore, in MRI machines—regardless of field strength—there is a trend towards an increasing number of radio frequency (RF) channels. A plurality of channels can be advantageous for example for displaying fast moving organs such as the heart.

Both the increasing field strength and the increasing number of RF channels lead to MRI machines and in particular the RF coils required becoming more complex. These RF coils are sometimes referred to as "antennas" or as "near-field antennas" and are conventionally constructed from a plurality of individual elements (for example 8-32 or even more). Such systems are described for example in Roemer, P. B. et al., "The NMR phased array", *Magnetic Resonance in Medicine* 16, 192-225 (1990) and Vaughan, J. T. et al., "RF Coils for MRI", Wiley, London (2012).

Multichannel coil arrays of this type are used both for transmitting RF pulses in order to stimulate the spin system and for receiving the high-frequency nuclear magnetic resonance signal. Ackerman, J. J. H. et al, "Mapping of metabolites in whole animals by $^{31}$P NMR using surface coils". Naure 283, 167-170 (1980) describes that resonant arrangements that are tuned to the Larmor frequency such as simple conductor loops can be used as active elements of an RF coil or of an RF coil array for MRI. From Hayes, C. E. et al., "An efficient, highly homogeneous radiofrequency coil for whole-body NMR imaging at 1.5 T", Journal of Magnetic Resonance 63, 622-628 (1985), birdcage configurations which are suitable for this purpose are known. Furthermore, strip conductors (R. F. Lee, R. F. et al., "Planar strip array (PSA) for MRI", Magnetic Resonance in Medicine 45, 673-683 (2001) and Driesel, W. et al., "A microstrip helmet coil for human brain imaging at high magnetic field", Concepts in Magnetic Resonance Part B (Magnetic Resonance Engineering) 33B, 94-108 (2008)), dipoles (Raajimakers, A. J. E. et al., "Design of a radiative surface coil array element at 7 T: The single-side adapted dipole antenna" Magnetic Resonance in Medicine 66, 1488-1497 (2011)) or for particular experiments, also patch antennas (Brunner, D. O. et al., "Travelling wave nuclear magnetic resonance" Nature 457, 994-999 (2009)) can be used. Regardless of which of these active elements are used, said elements are connected to the transmitting and receiving unit respectively of the MRI machine by feedlines. Conventionally, unsymmetrical, coaxial feedlines are provided for this purpose.

However, in practice, it has been shown that undesirable couplings of the active elements to the feedlines frequently occur, and this leads to a deterioration of the coil properties when sending and/or receiving. Since these couplings also represent a significant safety problem in particular in the case of very high field strengths, suitable countermeasures are required.

It is known from the prior art that reducing the coupling factor k between an active element and a feedline can act as such a countermeasure. One possibility for reducing the coupling factor to the feedline consists in providing an electrically symmetrical power supply to the active elements. This is often carried out in coaxial feedlines by means of balancing matching circuits or a balun (balun=balanced-unbalanced) for conversion between a symmetrical and an asymmetrical cable portion as a balanced-to-unbalanced transformer at the feed point. Picard, L. et al., describe the use of symmetrical feedlines in "Improvements in electronic decoupling of transmitter and receiver coils" Journal of Magnetic Resonance, Series B 106, 110-115 (1995).

Theoretically, the coupling factor could also be reduced by means of spatial symmetry, increased spacings or shielding measures, but this is possible to only a limited extent in multichannel coil arrays. In practice, it is not possible to achieve both perfect electrical and perfect spatial symmetry at the same time for each separate element with respect to all the feedlines in complex (multichannel) systems.

By way of example, in a simplified manner, each feedline can be considered to be part of a parasitic line resonator having one or more resonance frequencies. In coil arrays comprising several active elements and several feedlines, a plurality of different parasitic modes each having different resonance frequencies can be prompted (for example monopole, dipole and various multipole modes). According to equation 1, the strength of the coupling is dependent on the coupling factor:

$$k = M/\sqrt{L_p L_s} \qquad (1)$$

In addition, quality factors and the detuning of the active element and feedline modes also influence the coupling factor. In equation 1, $L_p$ and $L_s$ refer to the inductances of the primary circuit (for example an active element of the array) and of the secondary circuit (for example a feedline of the array as part of a parasitic resonator). M stands for the mutual inductance of the circuits. Furthermore, it is known that a coupling can take place not only inductively, but also capacitively or resistively. In order to take these factors into consideration, the coupling factor can be generalised according to equation 2.

$$k = Z_m/\sqrt{Z_p Z_s}, \qquad (2)$$

In this case, $Z_m$ stands for the common impedance and $Z_p$ and $Z_s$ stand for the impedances of the primary and secondary circuits respectively. For RF coils or RF coil arrays of the type described above, a very low and thus highly subcritical coupling is sought. The critical coupling factor in the case of a coupling of two circuits having the same resonance frequency can be described by equation 3:

$$k_{crit} = 1/\sqrt{Q_p Q_s} \qquad (3)$$

In this case, $Q_p$ and $Q_s$ stand for the qualities of the primary and secondary circuits respectively. An example of a system with $Q_p=Q_s=100$, which represents a typical magnitude for RF coils for MRI, thus results in a critical coupling factor of just 0.01.

As can be seen from equation 3 and the example above, small qualities lead to high values for $k_{crit}$. Accordingly, a highly subcritical coupling can be achieved more easily when the primary and secondary circuits respectively have lower qualities. The region in which the critical coupling is not achieved, i.e. the condition $k<k_{crit}$, advantageously even $k<<k_{crit}$, is met, increases in the case of low qualities. Lower qualities are therefore advantageous in relation to low couplings.

However, it is disadvantageous to deliberately deteriorate the quality of the primary circuit $Q_p$, as this also leads to a reduction of the effectiveness when transmitting, and to a poorer signal-to-noise ratio (SNR) when receiving.

As described by Terman, F. E. in "Radio Engineering" McGraw-Hill, New York, p. 76-85 (1937) and Mispelter, J. et al., in "NMR Probeheads for Biophysical and Biomedical Experiments" Imperial College Press, London (2006), the coupling is also reduced when the coupling resonance circuits are detuned with respect to one another.

It is further known from the prior art that considering the currents induced by the coupling results in indications of undesirable couplings having a favourable influence. The currents of a useful signal are always equally great on the supply and return conductors (in coaxial cables, these correspond for example to the inner conductor or the inside of the shield respectively), and flow in the opposite phase. By contrast with the currents of a useful signal, the currents induced by undesirable couplings flow in the same phase and, in the case of shielded cables, are concentrated on the outside of the shielding by current displacement. Accordingly, the term "sheath wave" is derived therefrom.

So-called "sheath wave blockers" are further known from the prior art, which have in common the fact that, in a cable, they damp common-mode currents slightly, but damp differential-mode currents strongly. Since baluns also display such properties in some embodiments, sheath wave blockers are often (generally incorrectly) referred to as baluns in the literature.

With respect to the bandwidth thereof, sheath wave blockers can be categorised into types (i) broadband and (ii) resonant sheath wave blockers, wherein resonant sheath wave blockers are generally narrow-band. Broadband sheath wave blockers are conventionally based on either (a) an increase in the common-mode reactance or (b) an increase in the common-mode losses. An increase in the common-mode reactance of broadband sheath wave blockers (i) in accordance with variant (a) can be achieved for example by means of ferrites, wound cable segments (for example as a solenoid, butterfly arrangement or toroid) or disconnected cables comprising integrated transformers.

An increase in the common-mode losses of broadband sheath wave blockers (i) in accordance with variant (b) can be achieved for example by means of the use of a specific coaxial cable with poor conductivity to the outside of the outer conductor or resistors attached between the shieldings of adjacent coaxial cables.

Resonant (narrow-band) sheath wave blockers (ii) can be produced in the form of common-mode trap circuits. Examples of these are:

triaxial trap circuits, forming trap circuits from the coaxial-cable outer conductor and capacitors or inductively coupled trap circuits (so-called "floating traps").

However, all the above-mentioned sheath wave blockers each depending on the variant have various characteristic restrictions which are inherent in the system, which restrictions limit the possible uses thereof or have a negative effect on the effectiveness of the desired measure. Disadvantages of the above-mentioned sheath wave blockers are outlined in the following:

Broadband ferromagnetic ferrite or powdered iron cores are used on a large scale in technical applications, because when they are produced efficiently, they are compact and cost-effective to produce. However, it is not possible to use such systems in the region of the strong magnets of an MRI or NMR machine due to the strong interaction with the static magnetic fields thereof.

The increase in the common-mode inductance by means of wound cable segments of the feedline (for example into a solenoid or toroid) is limited by the space requirements demanded thereby. However, this is used for example in receiver coils (for example in commercial preamplifiers). However, since such arrangements (in particular solenoids) lead to new undesirable couplings and also additionally cause resonance effects as a result of the winding capacity which is inherent in the system, the use of said arrangements in an MRI or NMR machine is also severely limited.

An interruption in the common-mode currents by transformers inevitably leads to higher losses for the useful signal and therefore cannot reasonably be used (in particular for high-resolution) MRI or NMR experiments.

Systems of the type described for example in U.S. Pat. No. 6,982,378 B2 or von Boskamp, E. B. et al. "Broadband damping of cable modes", Proceedings of the 20th Annual Meeting of ISMRM, Melbourne, p. 2691 (2012) are very complex and/or uneconomical due to the particular (cost-intensive) materials or cables. In addition, the properties are determined by the selection of the material and cannot easily be adapted to specific requirements.

Resistors between the shieldings of adjacent coaxial cables are only effective in the special case where adjacent feedlines are stimulated in a parasitic manner in the differential mode.

Since, as described above, none of the broadband sheath wave blockers are absolutely suitable for use in the NMR or MRI field, narrow-band (resonant) sheath wave blockers are generally used for RF coils. As set out above, however, the fields of application thereof are also limited and are partly associated with considerable disadvantages.

In particular in the case of high-field MRI and NMR machines, there are numerous limitations relating to the use of RF coil arrays. One requirement of sheath wave blockers which is particular to these machines results from the large number of channels in said arrays. These make it necessary in particular in the case of small wavelengths λ for a very large number of sheath wave blockers to be used, which is possible to only a limited extent due to the limited volume (which is contingent on the construction of an NMR or MRI magnet having a relatively narrow sample opening or patient opening respectively). Since, in accordance with the Larmor condition (equation 4)

$$\omega_0 = \gamma B_0 \quad\quad (4)$$

the resonance frequency $\omega_0$ of a type of core having a gyromagnetic ratio $\gamma$ increases linearly with the field strength and as a result, the wavelength of the RF decreases inversely with $B_0$, practical implementation at high field strengths is associated with particular problems which could not be satisfactorily eliminated by the systems known up to now from the prior art.

An additional problem in the case of the systems known from the prior art lies in the fact that resonant sheath wave blockers, for their part, can be coupled in a parasitic manner to the active elements and also to one another. This leads to a deterioration in the effect up to the point where the arrangement is completely unusable. The parasitic coupling of resonant sheath wave blockers to active elements and/or to one another therefore requires additional measures for the prevention thereof. This can take place for example by means of specific spatial arrangements of the components relative to one another, additional shieldings or a certain detuning with respect to one another, wherein such measures also have disadvantages (such as high costs), cannot be implemented (or cannot be implemented fully) due to the spatial limitations, and furthermore cannot be successfully used in every case.

The problem addressed by the present invention is therefore that of providing a device and a method for supplying RF coils by means of symmetrical, shielded cables, which method does not have the above-mentioned disadvantages.

This problem is solved by a device for electrically linking electronic assemblies, components or peripheral units by means of at least one symmetrical, shielded cable which shields several conductors for at least one useful signal by means of at least one shielding against effects of external alternating electromagnetic fields, wherein a shielding of at least one cable has an interruption at at least one point, which interruption is bridged by a lossy or lossless two-terminal network (also referred to herein as a two-pole).

Such a device is also suitable in particular in the surroundings of strong magnetic fields for providing a good shielding of the useful signals in a restricted space and secondly effectively to prevent or at least reduce disruptions which are generated in combination with RF coils and/or antennas. Preferably, the electrically connected component is therefore a part or a peripheral unit of an MRI or NMR machine.

Preferably, such a device can therefore be used to conduct signals from or to components of an MRI or NMR machine. Preferably, an MRI or NMR machine of this type is able to generate magnetic fields having a strength of a few tesla (e.g. 0.1 T, 1 T, 3 T, 7 T or even more). This results in resonance frequencies in the case of the proton resonance ($^1$H-NMR or MRI) of 4.2-300 MHz or even higher. Preferably, such a device is therefore suitable for conducting signals from or to components of an MRI or NMR machine which is suitable for generating magnetic fields which are stronger than 1 T, preferably stronger than 3 T, more preferably at least 7 T.

In this case and in the following, a component should be understood to mean a part of such a device but also a peripheral unit. A component of such a device, which component is connected by means of an above-described device, is preferably an electronic assembly. Such a component within the meaning of a part of such a device can be for example a(RF) coil, an (RF) antenna, a coil array, an antenna array, a communications system which is integrated in the device, a camera which is integrated in the device, a motion sensor which is integrated in the device, a video and/or image display device which is integrated in the device, a loudspeaker which is integrated in the device, a microphone which is integrated in the device, a detection means for physiological signals, such as a heat sensor, which is integrated in the device, a blood pressure sensor, a position sensor and/or a heart rate monitor. Such a component within the meaning of a peripheral unit of such a machine can be any device which is arranged in the region of influence of the strong static magnetic field and/or of the alternating electromagnetic field, which is generated by the device generating the magnetic field and/or the alternating electromagnetic field. For example, a peripheral unit of this type can be an external communications system, an external camera, an external motion sensor, an external video and/or image display device, an external loudspeaker, an external microphone, an external detection means for physiological signals such as a heat sensor, a blood pressure sensor, a blood sugar measuring device or a heart rate monitor. A peripheral unit however should also include external control and evaluation units such as computers (including the peripheral equipment thereof such as input devices (keyboard, mouse, trackball, graphics tablets, touchpads etc.), printers, external storage media, display devices (e.g. monitors)). These control and evaluation units are conventionally connected to the device generating the magnetic field and/or to the antenna or coil via a data line. The device is suitable in particular for a data line or lines of this type of the control and evaluation unit for power supply.

The use of a device according to the invention is explicitly not restricted to applications in or in the surroundings of RF coils or RF coil arrays for NMR or MRI respectively. As mentioned above, there can also be advantages in using said device for other electrical components (e.g. as a feedline for said components). These can—but do not necessarily have to—be used in conjunction with an NMR or MRI machine or in the direct surroundings thereof and operated in the spatial vicinity of components of the RF system (e.g. of an RF coil or an RF coil array). An example of an application is the use in components for presenting audio-visual stimuli as part of so-called functional MRI experiments or for communication with patients during an MRI examination. Such components could be for example video glasses for visual presentation, a headphone system for presenting acoustic signals, a microphone for recording verbal responses of a test person or also a monitoring unit for recording physiological signals during an MRI examination. Applications for example in antenna technology, radio technology, in hi-fi systems, radar systems, radio equipment and microwave equipment are also possible. Other applications with other electrical components are also conceivable, and the above-mentioned list is provided merely by way of example.

A device is preferred for electrically linking electronic assemblies, components or peripheral units, in particular of an RF coil and/or RF antenna and/or a coil and/or antenna array, which are preferably arranged within the RF shielding (Faraday cage) of an MRI machine and are subjected to the stray field of single or several elements of an RF transmitter coil or of an RF transmitter coil array.

Symmetrical, shielded cables in which the shielding of each cable is interrupted at at least one point, and said interruption is bridged by means of an electrical two-terminal network, are advantageous in particular in the region of high-frequency stray fields, as arise for example in MRI or NMR machines. A device according to the invention lends itself in particular to the analyses carried out in these machines using nuclear induction. By means of the alternating electromagnetic fields arising in the case of these analysis methods, considerable interference can occur in electrical cables, which—as set out above—cannot be reduced to a sufficient extent using conventional methods.

A device according to the invention therefore lends itself in particular to supplying the active elements of an RF coil or an RF coil array respectively and/or of an RF antenna or an RF antenna array. Since the resonance frequency of the core (except for the (determined) ratio of the magnetic dipole moment of the core to the spin thereof (gyromagnetic ratio)) is proportional to the strength of the magnetic field in the location of the core, the resonance frequencies used for detection must also increase at very high field strengths. The alternating electromagnetic fields generated by the RF coil or the RF coil array respectively (at the resonance frequency) therefore have an increasingly negative influence on the wired connection of electronic assemblies, components or peripheral units, in particular in high-field MRI or NMR machines due to the high frequency.

A device of the type described above for electrically linking electronic assemblies, components or peripheral units by means of symmetrical, shielded cables has the advantage in particular that it can be used both for connecting individual RF coils and for coil arrays. In this case, the construction is compact and can be produced without cost-intensive special parts.

When linking electronic assemblies, components or peripheral units by means of shielded cables, conventionally only the differential-mode current through the inner conductors contributes to the forwarding of the useful signal. The shielding should shield the inner conductors against external electromagnetic fields. Every common-mode current along the shielding is parasitic.

The device has proven to be particularly advantageous when the cable is a twinaxial cable or a grouping of several coaxial cables. It is then particularly easy to provide the shielding of every cable with an interruption at one or optionally at a plurality of points. Such an interruption (sometimes also referred to as a "gap") is preferably electrically very short relative to the wavelength, and therefore the differential-mode wave impedance of the symmetrical cable does not change noticeably, and no appreciable additional reflections and losses occur for the useful signal. Preferably, an interruption in the shielding has a length of 0.001-50 mm, preferably of 0.01-10 mm and more preferably of 0.1-5 mm in the longitudinal direction of the cable. The interruption in the shielding is preferably less than the wavelength of the alternating electromagnetic field by a factor of 1/X. In this case, X is preferably in the range 10-5000, more preferably 100-500, more preferably 500-1500. For the signal transmission to the inner conductor, for a frequency of for example 300 MHz, as is used in some MRI or NMR machines, with a typical velocity factor through the dielectric medium of the cable of 0.7, the wavelength is 70 cm. When X=1000, a length of the interruption of approximately 1 mm would accordingly result in the longitudinal direction of the cable. Analogously, with this factor, a length of the interruption of approximately 0.75 mm would result in the case of a frequency of 400 MHz.

The at least one interruption is preferably arranged where a maximum of the amplitude (current antinode) of the (standing) wave induced by the irradiated (resonance) frequency would form in the cable (inter alia depending on the length of the cable) at the frequency range preferably used if no interruption was present. When considering the parasitic currents on the outside of the shielding, the dielectric medium is substantially air. Thus, for a frequency of for example 300 MHz, as is used in some MRI or NMR machines, the wavelength is approximately 100 cm.

Preferably, the two-pole bridging the interruption is selected from a group comprising a passive, linear two-terminal network (also referred to herein as a two-pole) (preferably an ohmic resistor, an inductive reactance and/or a capacitive reactance), a non-linear two-terminal network, a two-terminal network which can be switched by means of a controlled variable and a two-terminal network which can be changed continuously by means of a controlled variable (preferably a PIN diode, a varactor diode or a variable capacitor).

When bridging the interruption by means of a passive, linear two-terminal network (wherein in principle, any conceivable combination of ohmic resistor (R), inductance (L) and capacitance (C) can be used), use can be made of the fact that firstly a(n ohmic) effective resistor R can drastically reduce the resonance quality of the cable for all parasitic modes, and secondly, when bridging the interruption by means of a reactance (influencing L and/or C), the resonance frequencies of the parasitic modes can be shifted.

Variable, linear two-terminal networks for bridging the interruption offer the possibility of being able to change the properties of the bridging according to external influences or in experiments with various resonance frequencies (for example decoupling experiments), and thus being able to give the device the desired properties. It is therefore preferable for at least one two-terminal network of the device to be a two-terminal network which can be switched by means of a controlled variable or a two-terminal network which can be changed continuously by means of a controlled variable, more preferably a PIN diode, a varactor diode or a variable capacitor.

It can further be advantageous for the device to additionally comprise at least one balun which connects the symmetrical cable to the unsymmetrical output or input of a RF transmitter or RF receiver.

Examples of cables in which (at least) one interruption (and the bridging thereof) is particularly advantageous include: twinaxial cables; combinations of two coaxial cables; symmetrical, shielded cables; symmetrical, double-shielded cables in which only the outer shielding is interrupted and bridged; symmetrical, double-shielded cables in which the two shieldings are interrupted and bridged; and several shielded cables which are combined in an interrupted and bridged common outer shielding.

In another preferred embodiment, a device of the type described above additionally comprises an additional sheath wave blocker (such as a sheath wave blocker known from the above-mentioned prior art). By means of such a combination, it is possible for example to further increase the performance of the device. For example, by means of resistors introduced between the shieldings of adjacent coaxial cables, an increase in the common-mode losses can be achieved, and thus parasitic differential modes can be additionally attenuated. In such embodiments, arrangements have proven to be particularly advantageous in which the resistors, by which each the adjacent coaxial cables are connected to one another, are positioned where a voltage antinode is located.

Particularly preferred is the use of a device of the type described above for electrically linking electronic assemblies, components or peripheral units of an MRI or NMR machine.

Another essential aspect of the invention is a method for electrically linking electronic assemblies, components or peripheral units by means of at least one symmetrical, shielded cable which shields several conductors for at least one useful signal by means of at least one shielding against effects of an alternating electromagnetic field, wherein a shielding of at least one cable is provided with an interruption at at least one point, and said interruption is bridged by a lossy or lossless two-terminal network. By means of this method, it is possible to produce particularly simple and compact systems in which a good shielding of the useful signals against alternating electromagnetic fields (generated for example by RF coils and/or antennas) can be effectively produced in a restricted space. The interference induced by alternating electromagnetic fields can be prevented or at least reduced. In particular, as a result, cables can be prevented from resonating with one another in particularly complex systems, and thus a common resonance system of particularly great complexity results.

Further advantages, aims and properties of the present invention will be described in greater detail with reference to the following description of the accompanying drawings, in which a device according to the invention for supplying radio frequency (RF) coils by means of symmetrical, shielded cables is shown by way of example. Assemblies of the device for supplying RF coils by means of symmetrical, shielded cables, which correspond to one another in the drawings at least substantially in terms of the function thereof, can in this case be labelled with the same reference signs, wherein said assemblies do not have to be numbered and annotated in all the drawings.

Figure 1A:
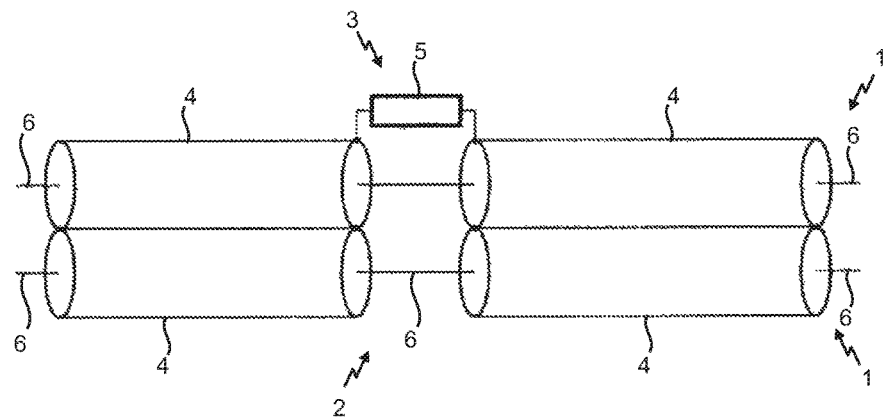
FIG. 1a is a schematic view of a combination of two coaxial cables having an interruption and bridging of the shielding.

FIG. 1a is a schematic view of a combination of two coaxial cables 1 having an interruption 2 and bridging 3 of the shielding 4. The bridging 3 of the interruption 2 takes place by means of an electrical two-pole (also referred to herein as a two-terminal network) 5, which can be for example an ohmic resistor. The inner conductors 6 are not interrupted. However, they are not surrounded by the (interrupted) shield 4 in the region of the interruption 2 and bridging 3 of the shielding 4. In the example shown in FIG. 1a, the inner conductors 6 are exposed in the region of the interruption 2. The interruption 2 is very short relative to the wavelength. In particular, it is also so short that the differential-mode wave impedance of the symmetrical cable is not changed (or is not noticeably or appreciably changed) by the electrically very short interruption 2. In particular, by means of a very short interruption 2, reflections and/or losses of the useful signal (transmitted in the inner conductor 6) can occur.

The one interruption 2 or even several interruptions 2 are preferably arranged where a current antinode of the sheath waves is located. In principle, longer cables may require a plurality of interruptions. The current antinode and the maximum respectively or maximums of the sheath waves vary dependent on the frequency by which they are induced. If this is to be expected (for example when using a very large frequency range), then it is advantageous to provide several interruptions 2 of the shielding 4. In this way, it can be ensured that, regardless of the precise location of the current antinode of the sheath waves (as it would be present in the outer conductor without interruptions), the shielding 4 is interrupted at points which effectively reduce the parasitic currents arising in the outer conductor.

All conceivable electrical two-poles or combinations thereof are suitable for the bridging 3. Thus, alternatively or in addition to the resistive two-pole 5 mentioned above by way of example, inductive and/or capacitive two-poles 5 are also possible.

The bridging 3 by an effective resistor R (e.g. an ohmic resistor) has an advantageous effect on the resonance quality of the cable for all parasitic modes, since these can also be drastically reduced thereby. By means of the bridging 3 of the interruption 2 by an inductive and/or capacitive two-pole (for example by a reactance), the resonance frequency of the parasitic modes can be shifted.

Non-linear two-poles 5 are also suitable for bridging 3 the interruption 2. By means of these, it is possible to shape the properties of the two-pole 5 according to level. Two-poles 5 which can be switched and/or changed continuously are also conceivable. A PIN diode (positive-intrinsic-negative diode) allows control by means of the current, a varactor diode allows control by means of the voltage, or a variable capacitor allows mechanical control.

Figure 1B:
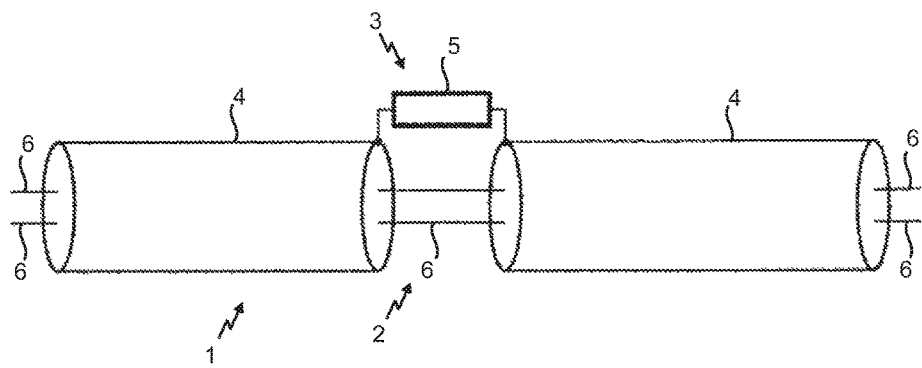
FIG. 1b is a schematic view of a symmetrically shielded cable having an interruption and bridging of the shielding.

FIG. 1b is a schematic view of a symmetrically shielded cable 1 having an interruption 2 and bridging 3 of the common shielding 4. In the example of a twinaxial cable 1 shown in FIG. 1b, two inner conductors 6 extend together in a shielding 4. The common shielding has an interruption 2 and a bridging 3. The bridging 3 can be produced, as described previously in relation to FIG. 1a, by means of any conceivable two-pole 5. Several interruptions 2 are also possible.

Figure 1C:
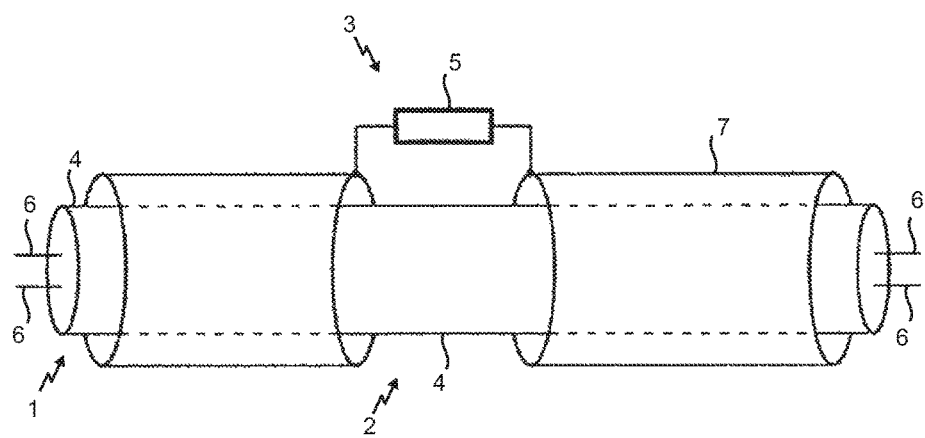
FIG. 1c is a schematic view of a symmetrical, double-shielded cable having an interruption and bridging of the outer shielding.

FIG. 1c is a schematic view of a symmetrical, double-shielded cable 1 having an interruption 2 and bridging 3 of the outer shielding 7. The inner shielding 4 remains intact in the region of the interruption 2 of the outer shielding 7. As a result, the inner conductors 6 are also shielded in the region of the interruption 2 (by the inner shielding 4). Consequently, they are also less susceptible to external influences and mechanical stresses in this region. The bridging can also be implemented in this case by a two-pole 5.

Figure 1D:
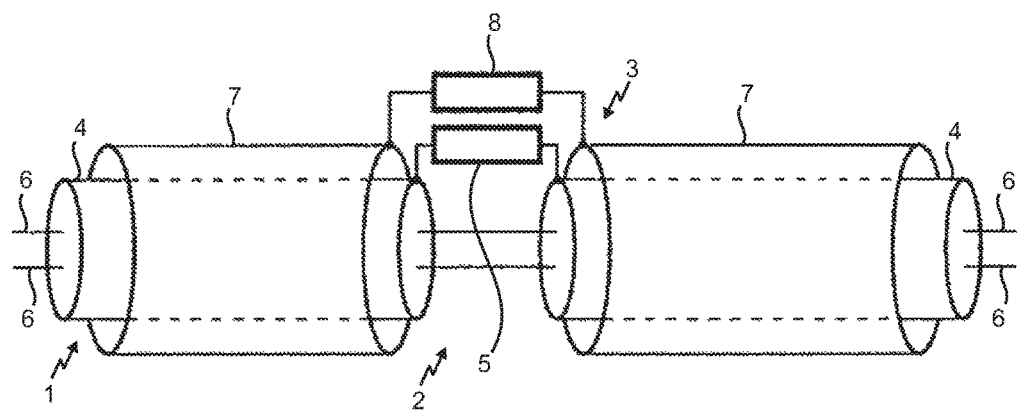
FIG. 1d is a schematic view of a symmetrical, double-shielded cable having respective interruptions and bridgings of each of the two shieldings.

FIG. 1d is a schematic view of a symmetrical, double-shielded cable 1 having respective interruptions 2 and bridgings 3 of each of the two shieldings 4, 7. This embodiment has the advantage that the inner conductors 6 are double-shielded by the two shieldings 4 and 7 and thus are particularly impervious to external influences. Both shieldings 4, 7 are interrupted, and therefore differential-mode currents can be effectively prevented or at least reduced. For the bridging 5 of the inner shielding 4, a two-pole 5 can be used. Such a two-pole or another two-pole 8 is also provided for bridging 5 the outer shielding 7. By using two different two-poles, it is particularly advantageously possible, by means of the bridging 3 with an effective resistor R as one of the two-poles 5, 8 firstly to achieve a reduction of the resonance quality of the cable for all parasitic modes. Secondly, by means of a bridging 3 with an inductive and/or capacitive two-pole as one of the two-poles 5, 8 for shifting the resonance frequency of the parasitic modes, various interferences can be effectively limited.

Figure 1E:
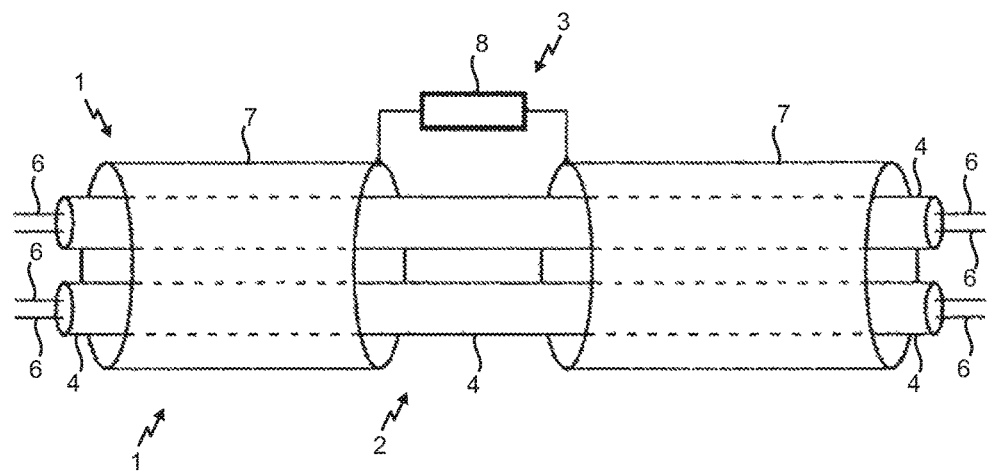
FIG. 1e is a schematic view several of respectively shielded cables bundled within an outer shielding, having an interruption and bridging of the outer shielding.

FIG. 1e is a schematic view of several of respectively shielded cables 1 bundled within an outer shielding, having an interruption 2 and bridging 3 of the outer shielding 7. The arrangement is similar to the view shown in FIG. 1c. The inner shielding 4 of the two cables in this example also remains intact in the region of the interruption 2 of the outer shielding 7. This also leads, in the case of the arrangement shown in FIG. 1e, to the inner conductors 6 each being separately shielded in the region of the interruption 2 (each by the inner shielding 4 surrounding the respective inner conductors 6). Consequently, they are also less susceptible to external influences and mechanical stresses in this region. The bridging can also be implemented in this case by a two-pole 5.

Figure 2:
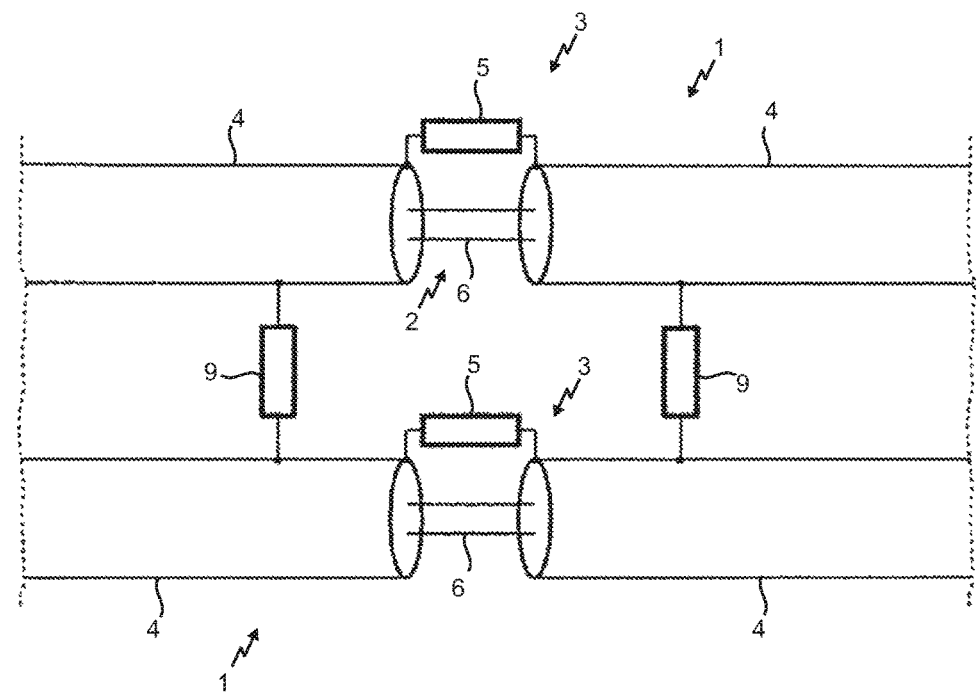
FIG. 2 is a schematic view of two cables each having an interruption and bridging of the shieldings, the adjacent outer conductors of which are connected by ohmic resistors.

FIG. 2 is a schematic view of two cables (coaxial cables) 1 each having an interruption 2 and bridging 3 of the respective shieldings 4, the adjacent outer conductors 4 of which are connected by ohmic resistors 9. By means of such an arrangement, it is possible to increase the (parasitic) common-mode losses. Parasitic differential modes can be attenuated. In principle—as already mentioned above—the above-mentioned feedlines 1 can be combined with an outer conductor 4 which is interrupted and bridged by a two-pole 5, and with all known sheath wave blockers. For example, ferrites, solenoids, butterfly arrangements or other sheath wave blockers could be used. However, since these—as described above—partly have major disadvantages, arrangements are preferred which can also be effectively used in the case of strong magnetic fields. Therefore in particular the arrangement shown in FIG. 2 is preferred, in which the shielding 4 of a plurality of (preferably) adjacent coaxial cables 1 are connected to one another by (preferably ohmic) resistors 9. In such embodiments, it has proven to be particularly advantageous for the resistors 9, by which each of the two different coaxial cables 1 are connected to one another, to be positioned where a voltage antinode is located.

Figure 3A:
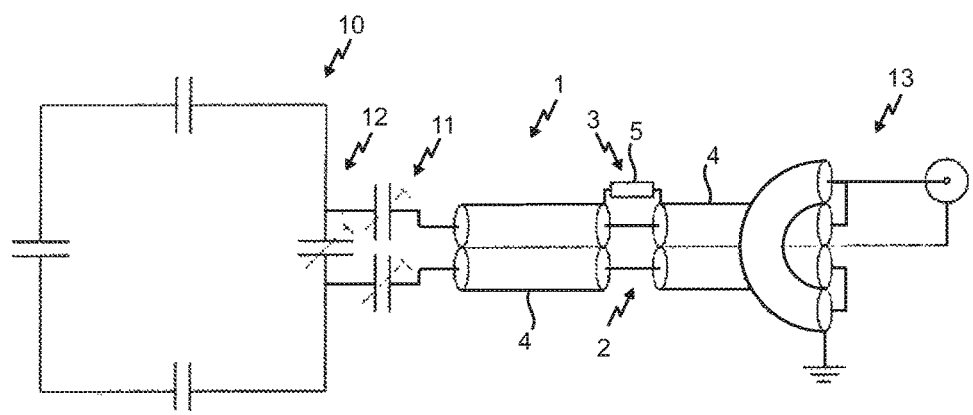
FIG. 3a is a schematic view of a square conductor loop as an active element of an RF coil comprising a symmetrical circuit at the feed point for tuning to the differential-mode wave impedance of the symmetrical feedline having an interrupted shielding.

FIG. 3a is a schematic view of a square conductor loop 10 as an active element of an RF coil comprising a symmetrical circuit 11 at the feed point 12 for tuning to the differential-mode wave impedance of the symmetrical feedline 1 having an interrupted shielding 4. As shown in FIG. 3a, at the feed point 12 of the active element 10 of an RF coil or an RF coil array (shown in FIG. 3a as a square conductor loop having four distributed capacitors), a symmetrical circuit 11 can be arranged which makes it possible to tune to and match the differential-mode wave impedance of the symmetrical feedline 1. The shielding of said cable has an interruption 2 at (at least) one point. As shown in FIG. 1a-1e and described above, in this example, the interruption 2 is also bridged by a lossy two-pole 5 (for example having an ohmic resistor). In this example, the interruption(s) is(/are) preferably arranged close to or in a position in which a current antinode of the sheath waves is/would be located (without the interruption). When located in this region, the maximum effect can be expected. A balun 13 is arranged at the end of the symmetrical feedline 1 which is remote from the coil. In the embodiment shown in FIG. 3a, the line is a $\lambda/2$ phasing line.

In such an arrangement, the symmetrical feedline 1 is preferably at least so long that an unsymmetrical coaxial cable connected after the balun can no longer be noticeably coupled to the active elements. Even if it is not shown in FIG. 3a, it can be advantageous (in particular in multichannel coil arrays) to connect the shieldings of several, preferably all of the feedlines 1 by means of (preferably ohmic) resistors to one another, as shown analogously in FIG. 2.

Figure 3B:
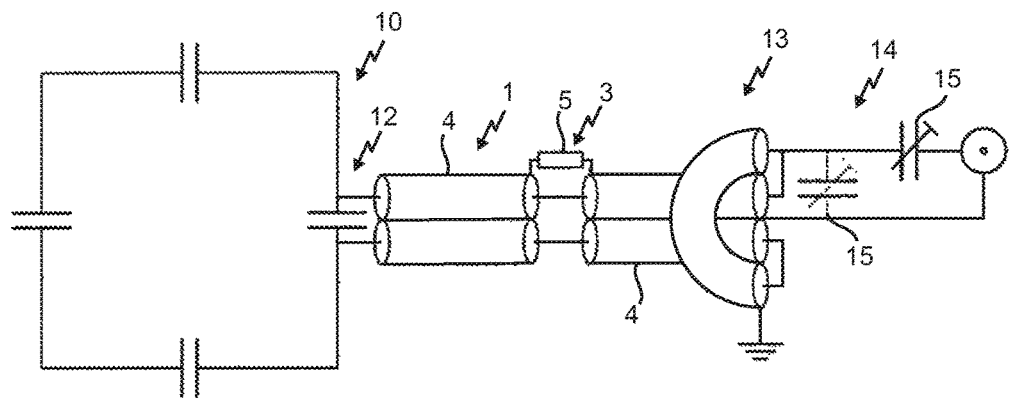
FIG. 3b is a schematic view of a square conductor loop as an active element of an RF coil comprising a symmetrical feedline having an interrupted shielding and a balun which is arranged at the end of the feedline which is remote from the coil.

FIG. 3b is a schematic view of an alternative connection of a square conductor loop 10 as an active element of an RF coil via a symmetrical feedline 1 having an interrupted shielding 4 by means of a balun 13 which is arranged at the end of the feedline 1 which is remote from the coil.

In this example, a square conductor loop 10 having four distributed capacitors is also connected to a shielded, symmetrical cable 1. By contrast with the arrangement shown in FIG. 3a, however, said cable is directly connected to the conductor loop, without a symmetrical circuit 11 being provided at the feed point 12 for tuning to the differential-mode wave impedance. The shielded, symmetrical cable 1 can comprise a twinaxial cable or several coaxial cables as shown in the example shown in FIG. 3a. For example, shielded, twisted cables can also be provided. As in the case of the examples above, the shield 4 of said cable 1 is provided with an interruption 2 at (at least) one point (optionally also at a plurality of points), which interruption is bridged by a lossy two-pole 5 (for example by an ohmic resistor). In this example, the interruption(s) 2 is (are) preferably also arranged where a current antinode of the sheath waves is/would be located (without the interruption). The electrical length of the symmetrical cable 1 is preferably N×($\lambda/2$). In this case, N is a (preferably small) natural number (N≥1). At the end of the cable which is remote from the coil, a balun 13 is located which is in the form of a $\lambda/2$ phasing line, just as in the embodiment shown previously in FIG. 3a. On the side of the balun 13 which is remote from the feedline 1 to the coil, an unsymmetrical circuit 14 is arranged for matching the wave impedance $Z_0$ of the unsymmetrical output of the transmitter or the input of the receiver respectively. The complexity of this arrangement is reduced with respect to that shown in FIG. 3a, since the matching circuit is arranged behind the balun. The number of assemblies can be reduced with respect to the embodiment shown in FIG. 3a since, as shown in FIG. 3b, the unsymmetrical circuit 14 for matching the wave impedance $Z_0$ can comprise two simple variable capacitors 15 ("trimmers"). Since the matching and tuning processes are determined only by the properties of the balun, said processes are not changed by the symmetry of the cable 1.

The balun shown in FIG. 3b is configured for example in such a way that it transforms impedances in the ratio 4:1. Accordingly, capacity values which are approximately four times higher (with respect to an embodiment without additional transformers) are required for the trimmers.

By means of the embodiments described above, it is possible to use a particularly large number of suitable components, and this leads to a great degree of flexibility in the selection thereof. In particular when designing feedlines for RF coils or coil arrays for use in powerful MRI (or NMR) machines, which operate at very high field strengths (of for example 7 T or even higher), this is very advantageous.

Figure 3C:
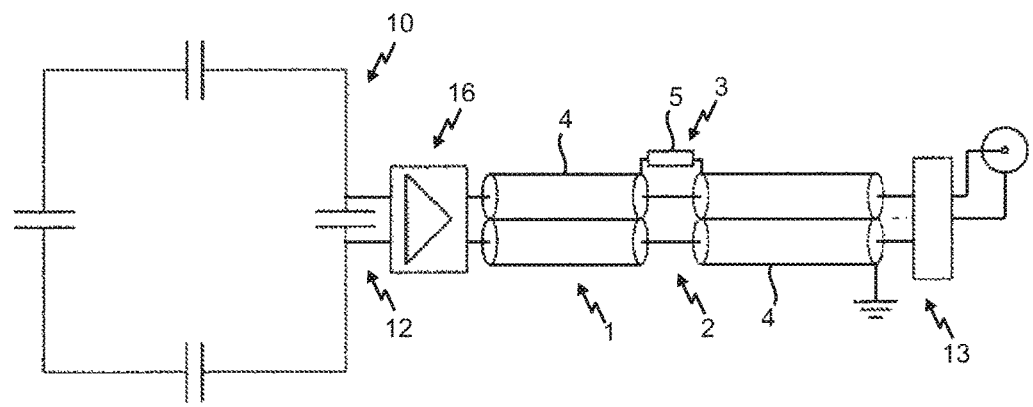
FIG. 3c is a schematic view of a square conductor loop as an active element of an RF coil comprising a symmetrical preamplifier at the feed point comprising a symmetrical feedline having an interrupted shielding and a balun which is arranged at the end of the feedline which is remote from the coil.

FIG. 3c is a schematic view of a square conductor loop 10 as an active element of an RF coil comprising a symmetrical preamplifier 16 at the feed point 12 comprising a symmetrical feedline 1 having an interrupted shield 4 and a balun 13 which is arranged at the end of the feedline 1 which is remote from the coil.

In this example, too, a square conductor loop 10 having four distributed capacitors is connected to a shielded, symmetrical cable 1. As is also the case in the arrangement shown in FIG. 3a, said cable is not directly connected to the conductor loop. As shown in FIG. 3c, a symmetrical preamplifier 16 for tuning to the differential-mode wave impedance can be provided at the feed point 12. The shielded, symmetrical cable 1 is, as is also the case in the examples shown in FIGS. 3a and 3b, a twinaxial cable or a bundle of several coaxial cables. The shielding 4 of said twinaxial cable or coaxial cable bundle is, as is also the case in the examples above, formed so as to be discontinuous at (at least) one point (optionally also at a plurality of points) by means of an interruption 2 and is bridged in each case by a lossy or lossless two-pole 5 (for example by an ohmic resistor). In this example, the interruption(s) 2 is(/are) also preferably arranged where a current antinode of the sheath waves is/would be located (without the interruption). A balun 13 is located at the end of the cable which is remote from the coil.

All of the features disclosed in the application documents are claimed as being essential to the invention, whether they are novel individually or in combination over the prior art.

LIST OF REFERENCE NUMERALS

1 cable, coaxial cable, twinaxial cable
2 interruption
3 bridging
4 (inner) shielding
5 two-terminal network (two-pole)
6 inner conductor
7 (outer) shielding
8 two-terminal network (two-pole)
9 (ohmic) resistor
10 conductor loop, active element of an RF coil
11 symmetrical circuit
12 feed point
13 balun
14 unsymmetrical circuit
15 variable capacitor, trimmer

The invention claimed is:

1. A device for electrically linking electronic assemblies, components or peripheral units, said device comprising two or more conductors and at least one symmetrical, shielded cable, wherein the at least one symmetrical, shielded cable shields at least one useful signal transmitted by the two or more conductors against effects of an alternating electromagnetic field,
   wherein the at least one symmetrical, shielded cable is a twinaxial cable or a grouping of several coaxial cables and comprises a shielding which surrounds portions of the two or more conductors, said shielding having an interruption at at least one point,
   wherein said interruption is bridged by a passive, linear two-terminal network, said passive, linear two-terminal network comprising an ohmic resistor, and
   wherein the two or more conductors are exposed in the region of the interruption and are not interrupted in the region of the interruption and bridging of said shielding.

2. The device according to claim 1, wherein the component is a part or a device peripheral unit of an integrated device.

3. The device according to claim 1, wherein the component is a part or a peripheral unit of a MRI or NMR machine.

4. The device according to claim 3, wherein the MRI or NMR machine is suitable for generating magnetic fields which are stronger than 0.1 T.

5. The device according to claim 3, wherein the MRI or NMR machine is suitable for generating magnetic fields which are stronger than 3 T.

6. The device according to claim 3, wherein the MRI or NMR machine is suitable for generating magnetic fields which are 7 T or stronger.

7. The device according to claim 2, wherein the component, the part or the peripheral unit is selected from a group selected from the group consisting of an RF coil, an RF antenna, a coil, an antenna array, control electronics, a communications system, a camera, a motion sensor, a video, an image display device, a loudspeaker, a microphone, a detection means for physiological signals, a heat sensor, a blood pressure sensor, a position sensor, a heart rate monitor, and combinations thereof.

8. The device according to claim 1, wherein the at least one symmetrical, shielded cable is electrically connected to an RF coil and/or RF antenna and/or a coil and/or antenna array.

9. The device according to claim 1, wherein the two-terminal network can be changed continuously by means of a PIN diode, a varactor diode or a variable capacitor.

10. The device according to claim 1, wherein the device further comprises at least one balun.

11. The device according to claim 1, wherein the device comprises at least one additional sheath wave blocker.

12. The device according to claim 1, wherein the interruption in the shielding has a length of 0.001-50 mm in the longitudinal direction of the at least one symmetrical, shielded cable.

13. The device according to claim 1, wherein the interruption in the shielding has a length of 0.01-10 mm in the longitudinal direction of the at least one symmetrical, shielded cable.

14. The device according to claim 1, wherein the interruption in the shielding has a length of 0.1-5 mm in the longitudinal direction of the at least one symmetrical, shielded cable.

15. The device according to claim 1, wherein the interruption is arranged in a location where a maximum of the amplitude of a wave induced by the alternating electromagnetic field would form in the shielding of the at least one symmetrical, shielded cable in conjunction with the alternating electromagnetic field, if no interruption was present.

16. The device according to claim 1, wherein the at least one symmetrical, shielded cable comprises:
   a) an inner shielding which surrounds portions of the two or more conductors, said inner shielding having a first shielding interruption at at least one point, wherein said first shielding interruption is bridged by a first passive, linear two-terminal network comprising an ohmic resistor, and wherein the two or more conductors are exposed in the region of the interruption and are not interrupted in the region of the interruption and bridging of said shielding; and b) an outer shielding which surrounds at least a portion of the inner shielding, said outer shielding having a second shielding interruption at at least one point, wherein said second shielding interruption is bridged by a second passive, linear two-terminal network.

17. The device according to claim 1, wherein the device comprises two symmetrical, shielded cables, each symmetrical, shielded cable comprising two conductors and a shielding which surrounds portions of the two conductors, wherein the shielding of each symmetrical, shielded cable has an interruption at at least one point, wherein said interruption of each symmetrical, shielded cable is bridged by a passive, linear two-terminal network comprising an ohmic resistor, and wherein the shieldings of the two symmetrical, shielded cables are connected to one another by one or more connecting resistors.

18. A method for electrically linking electronic assemblies, components or peripheral units comprising the steps of:

providing at least one symmetrical, shielded cable around two or more conductors wherein the at least one symmetrical, shielded cable is a twinaxial cable or a grouping of several coaxial cables and comprises a shielding which surrounds portions of the two or more conductors, said shielding having an interruption at at least one point, wherein said interruption is bridged by a passive, linear two-terminal network, said passive, linear two-terminal network comprising an ohmic resistor, and wherein the two or more conductors are exposed in the region of the interruption and are not interrupted in the region of the interruption and bridging of said shielding; and shielding at least one useful signal transmitted by the two or more conductors against effects of an alternating electromagnetic field.

* * * * *